United States Patent
Lin et al.

(10) Patent No.: US 12,198,904 B2
(45) Date of Patent: *Jan. 14, 2025

(54) THIN-FILM-DEPOSITION EQUIPMENT

(71) Applicant: SKY TECH INC., Hsinchu County (TW)

(72) Inventors: Jing-Cheng Lin, Hsinchu County (TW); Yu-Te Shen, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 649 days.

This patent is subject to a terminal disclaimer.

(21) Appl. No.: 17/484,611

(22) Filed: Sep. 24, 2021

(65) Prior Publication Data
US 2022/0415623 A1 Dec. 29, 2022

(30) Foreign Application Priority Data

Jun. 29, 2021 (TW) .................................. 11012822

(51) Int. Cl.
*H01J 37/32* (2006.01)
*C23C 16/44* (2006.01)
*C23C 16/455* (2006.01)
*C23C 16/52* (2006.01)

(52) U.S. Cl.
CPC .... *H01J 37/32651* (2013.01); *C23C 16/4405* (2013.01); *C23C 16/45589* (2013.01); *C23C 16/52* (2013.01); *H01J 37/32715* (2013.01); *H01J 2237/332* (2013.01)

(58) Field of Classification Search
USPC ................................ 118/712, 715, 504, 720
See application file for complete search history.

(56) References Cited

U.S. PATENT DOCUMENTS

| | | | |
|---|---|---|---|
| 6,511,585 B1* | 1/2003 | Shi ..................... | H01J 37/32055 118/723 VE |
| 11,476,101 B1* | 10/2022 | Lin .................... | H01L 21/67028 |
| 11,482,403 B1* | 10/2022 | Lin .................... | H01J 37/32935 |
| 11,532,469 B1* | 12/2022 | Lin .......................... | C23C 14/34 |
| 11,596,973 B2* | 3/2023 | Lin ....................... | B05C 21/005 |
| 11,898,238 B2* | 2/2024 | Lin ................... | H01L 21/67213 |

(Continued)

*Primary Examiner* — Yewebdar T Tadesse
(74) *Attorney, Agent, or Firm* — Chun-Ming Shib; HDLS IPR SERVICES

(57) ABSTRACT

The present disclosure provides a thin-film-deposition equipment, which includes a main body, a carrier and a shielding device, wherein a portion of the shielding device and the carrier are disposed within the main body. The main body includes a reaction chamber, and two sensor areas connected to the reaction chamber, wherein the sensor areas are smaller than the reaction chamber. The shielding device includes a first-shield member, a second-shield member and a driver. The driver interconnects the first-shield member and the second-shield member, for driving the first-shield member and the second-shield member to move in opposite directions. During a deposition process, the two shield members are separate from each other into an open state, and respectively enter the two sensor areas. During a cleaning process, the driver swings the shield members toward each other into a shielding state for covering the carrier.

20 Claims, 14 Drawing Sheets

(56) References Cited

U.S. PATENT DOCUMENTS

| | | | | |
|---|---|---|---|---|
| 2003/0155230 A1* | 8/2003 | Shi | ............... | H01J 37/32055 |
| | | | | 204/298.41 |
| 2003/0155234 A1* | 8/2003 | Feltsman | ............. | C23C 14/566 |
| | | | | 118/712 |
| 2004/0182698 A1* | 9/2004 | Feltsman | ............. | C23C 14/566 |
| | | | | 204/298.11 |
| 2019/0316251 A1* | 10/2019 | Tsai | ..................... | C23C 14/52 |

* cited by examiner

THIN-FILM-DEPOSITION EQUIPMENT

TECHNICAL FIELD

The present disclosure relates to a thin-film-deposition equipment, which mainly employs a shielding device to cover a substrate carrier, in order to prevent polluting the carrier during a process of cleaning the reaction chamber.

BACKGROUND

Thin-film-deposition equipments, such as chemical-vapor deposition (CVD), physical-vapor deposition (PVD) and the atomic-layer deposition (ALD) equipments, those are commonly employed in manufacturing process of semiconductors, light-emitting diodes and displays, etc.

A thin-film-deposition equipment mainly includes a chamber and a substrate carrier, wherein the substrate carrier is within the chamber for carrying at least one substrate. To exemplify by PVD, a target material is required to dispose within the chamber, wherein the target material faces the substrate on the substrate carrier. When performing PVD, noble gas or reactive gas is transferred into the chamber, then bias electricity is applied on the target material and the substrate carrier respectively, also the substrate carried on by the substrate carrier is heated up.

The noble gas or reactive gas within the chamber transforms into ionized gas in effect of a high-voltage electric field, then the ionized gas is attracted by the bias electricity to bombard the target material. Thereby, atoms or molecules splashed from the target material are attracted by the bias electricity on the substrate carrier, then be deposited on surface of the substrate and forms a thin film on the surface of the substrate.

After some time of usage, an inner surface of the chamber may also be formed with thin film, then a periodic cleaning is required to perform to the chamber, in order to prevent the waste thin film from dropping onto the substrate and causing pollution during the process of thin-film deposition. Moreover, surface of the target material may be formed with oxide or other pollutant, therefore requires a periodic cleaning as well. Generally, a burn-in process is applied to bombard the target material within the chamber by plasma ions, then to remove the oxides or pollutants on the surface of target material.

To perform the abovementioned cleaning process, the substrate carrier and the substrate must be extracted or kept out, to prevent the removed pollutant from turning to pollute the substrate carrier and the substrate, during the cleaning process.

SUMMARY

Generally, after some time of usage, the thin-film-deposition equipment is required for cleaning, in order to remove the waste thin film within the chamber and the oxide or nitride on the target material. During the cleaning process, some removed pollutant particles may turn to pollute the substrate carrier, thus there is a need to keep out the substrate carrier from the removed pollutant. The present disclosure provides a thin-film-deposition equipment, which mainly employs a driver to rotate and swing two shield members in opposite angular directions to approach or leave each other, such that to operate between a shielding state and an open state. Thereby, the shield members in shielding state can cover and shield the substrate carrier, to prevent the removed pollutant particles from turning to pollute the substrate carrier during the process of cleaning the chamber or the target material.

An object of the present disclosure is to provide a thin-film-deposition equipment with shielding device, which includes a main body, a carrier and a shielding device, wherein the carrier and a part of the shielding device are disposed within the main body. The main body includes a reaction chamber having a containing space therein, and two sensor areas connected to the reaction chamber, wherein each of the sensor areas has a sensing space fluidly connected to the containing space.

During a process of cleaning the reaction chamber, the driver swings the two shield members to approach each other into the shielding state, such that the two shield members come together to cover the substrate carrier within a containing space, in order to prevent a plasma employed to proceed the cleaning or some removed waste pollutant from turning to pollute the substrate carrier and/or the substrate thereon. Alternatively, during a process of performing the deposition, the driver swings the two shielding members to leave each other, such that to permit the process to proceed on the substrate within the reaction chamber.

In the open state, the two shield members are separate from each other, wherein the two shield members partially enter the two sensor areas of the main body, respectively. Moreover, each of the two sensor areas is disposed with at least one position sensor, for detecting and confirming that the shield members have entered the sensor areas and been in the open state.

An object of the present disclosure is to provide a thin-film-deposition equipment with shielding device, which employs two shield members that can combine to form a whole shield, thereby to improve space efficiency. In one embodiment, the two shield members sway in opposite angular directions within the containing space of the main body, wherein the main body includes a reaction chamber and two sensor areas. The two shield members are operable between an open state and a shielding state within the containing space of the reaction chamber. In the shielding state, the two shield members come together and cover the carrier within the containing space of the reaction chamber. In the open state, the two shield members respectively and partially enters the two sensor areas, wherein the position sensors in the sensor areas detect and confirm that the shield members have entered the sensor areas and been in the open state.

When it is confirmed by the sensor areas that the shield members are in the open state, the carrier is permitted to move toward the target material, for performing a thin-film deposition to the substrate on the carrier. Such that to prevent the shield members from interfering the movement of the carrier and causing collision therebetween, then resulting in damage to the shield members or the carrier.

An object of the present disclosure is to provide a thin-film-deposition equipment, wherein the driver interconnects the two shield members via two connecting arms, each of the connecting arms sustains a behalf of the shield member. Moreover, the two connecting arms may be configured to sustain thicker shield members, which are durable against deformation caused by high temperature, for better performance of the shield members.

To achieve the abovementioned object, the present disclosure provides a thin-film-deposition equipment, which includes: a main body that has a reaction chamber formed with a containing space therein, and two sensor areas fluidly connected to the containing space, wherein each of the sensor areas has a height shorter than that of the reaction chamber; a carrier disposed within the containing space for carrying at least one substrate; and a shielding device includes a first-shield member and a second-shield member, a driver interconnecting the first-shield member and the second-shield member for respectively swinging the first-shield member and the second-shield member in opposite directions, such that the first-shield member and the second-shield member are switchable between an open state and a shielding state, wherein in the open state, the first-shield member and the second-shield member are partially within sensing space of the sensor areas, and wherein in the shielding state, the first-shield member and the second-shield member are within the containing space for covering the carrier.

Another object of the present disclosure is to provide the abovementioned thin-film-deposition equipment, wherein each of the two shield members has a surface facing each other and respectively disposed with a cavity and a protrusion. The driver drives and swings the two shield members to approach each other, wherein the protrusion on one of the shield member is inserted into the cavity on another one of the shield member, such that the two shield members form a whole shield.

To achieve the abovementioned object, the present disclosure provides the aforementioned thin-film-deposition equipment, wherein: the first-shield member includes a first-inner-edge surface formed with at least one protrusion; the second-shield member includes a second-inner-edge surface formed with at least one cavity corresponding to the protrusion of the first-inner-edge surface.

Another object of the present disclosure is to provide the abovementioned thin-film-deposition equipment, wherein the shielding device further includes two guard plates, for guarding the shield members from damage caused by high-temperature matters or the heat itself.

To achieve the abovementioned object, the present disclosure provides the aforementioned thin-film-deposition equipment, which includes a first-guard plate disposed on a surface of the first-shield member; and a second-guard plate disposed a surface of the second-shield member, wherein the first-guard plate and the second-guard plate also can approach each other to cover the first-shield member and the second-shield member together.

Another object of the present disclosure is to provide the abovementioned thin-film-deposition equipment, wherein the shielding device includes two drivers respectively connected to the two shield members.

To achieve the abovementioned object, the present disclosure provides the aforementioned shielding device, wherein the driver includes: a first driver connected to the first-shield member; and a second driver connected to the second-shield member, wherein the first driver and the second driver respectively drive and swing the first-shield member and the second-shield member in the opposite directions, thereby the first-shield member and the second-shield member are switchable between the open state and the open state.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
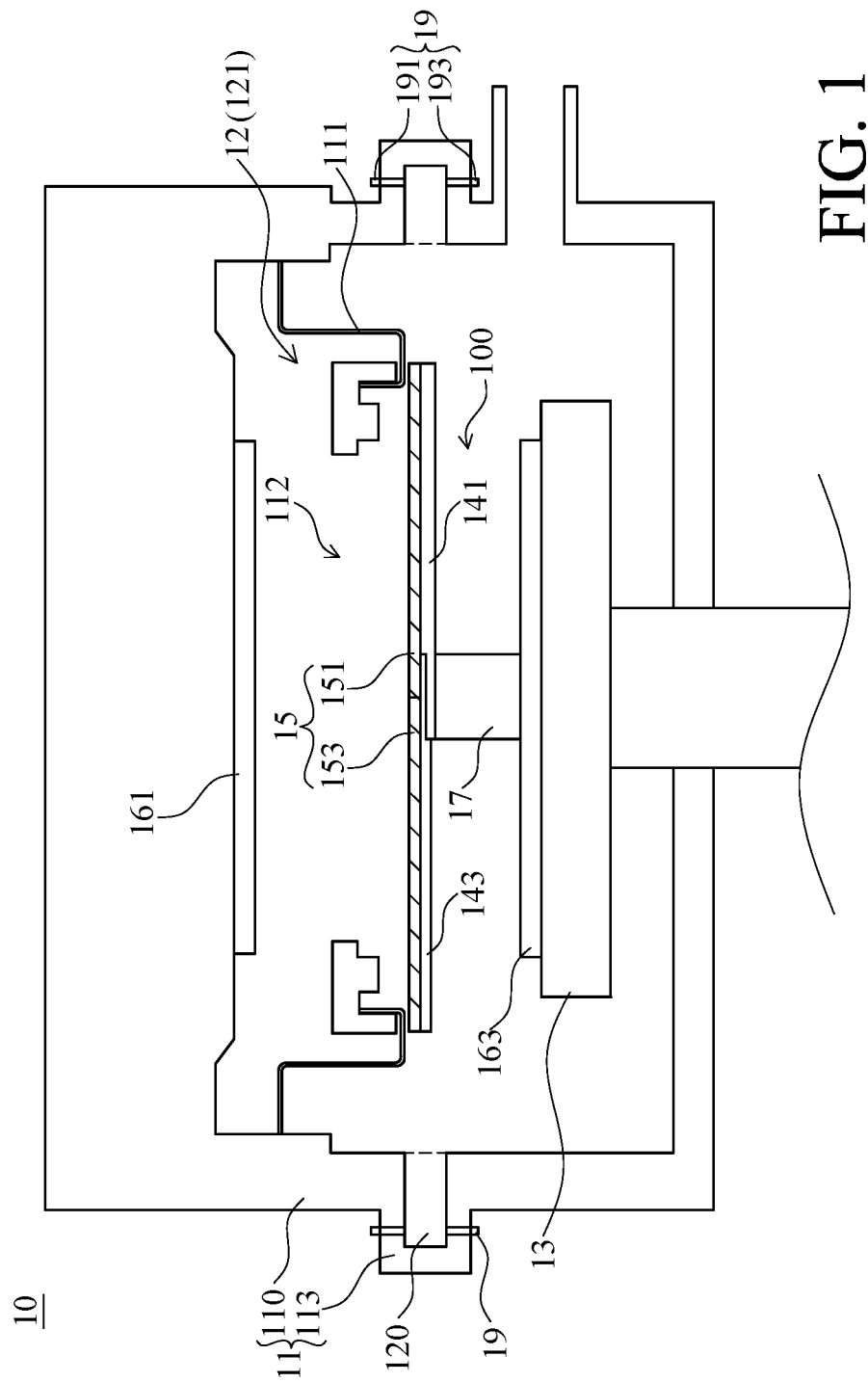
FIG. 1 is a schematic sectional view illustrating a shielding device of a thin-film-deposition equipment which is operated in a shielding state, according to one embodiment of the present disclosure.

Referring to FIG. 1, which is a schematic sectional view illustrating a shielding device 100 of a thin-film-deposition equipment 10 which is operated in a shielding state, according to one embodiment of the present disclosure. As shown in the FIG, the thin-film-deposition equipment 10 main includes a main body 11, a carrier 13 and a shielding device 100. The main body 11 includes a reaction chamber 110, and two sensor areas 113 connected to the reaction chamber 110.

The reaction chamber includes a containing space 12, for containing the carrier 13 and a part of the shielding device 100. Each of the sensor areas 113 includes a sensing space 120, wherein each of the sensing spaces 120 is fluidly connected to containing space 12 of the reaction chamber 110.

The carrier 13 is positioned within the containing space 12 of the reaction chamber 11, for carrying at least one substrate 163. In this embodiment, the thin-film-deposition equipment 10 is exemplified as a physical-vapor deposition chamber. The reaction chamber 110 is disposed within a target material 161 and has the target material 161 facing the substrate 163 and the carrier 13. The target material 161 may be disposed on a ceiling surface of the reaction chamber 110 to face the carrier 13 and/or the substrate 163 within the containing space 12, for example.

Figure 2:
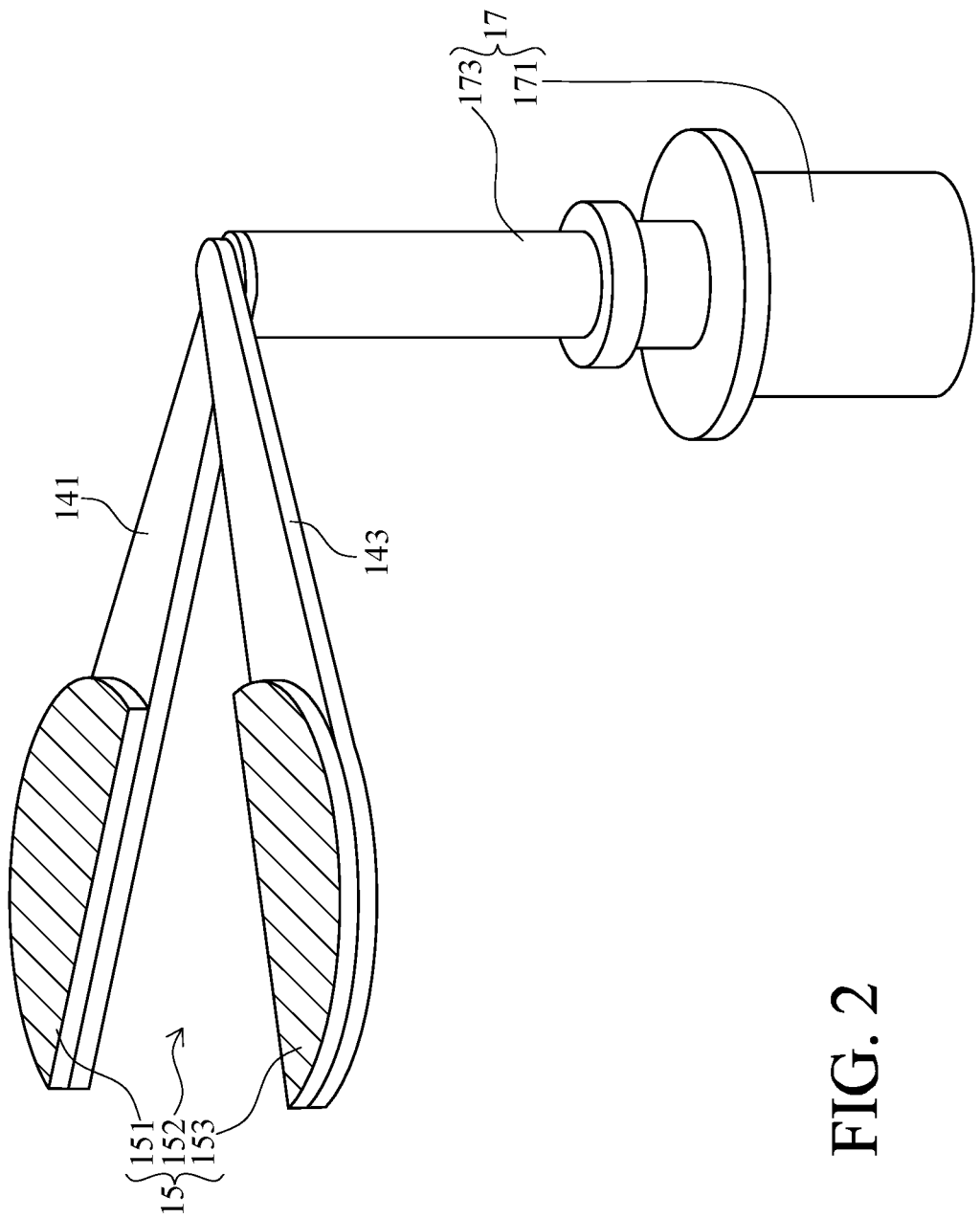
FIG. 2 is a schematic perspective view illustrating the shielding device of the thin-film-deposition equipment which is operated in an open state, according to one embodiment of the present disclosure.
Figure 3:
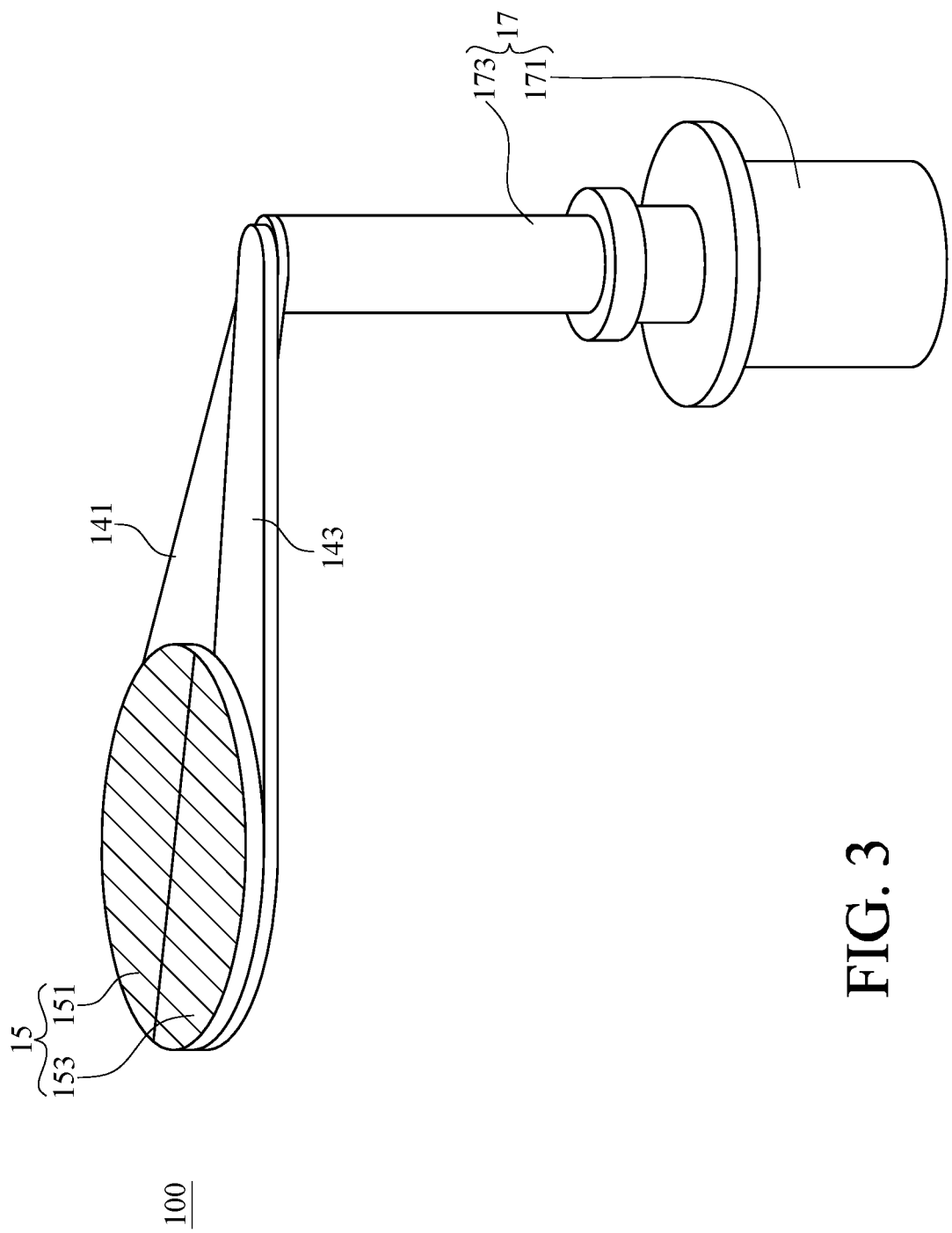
FIG. 3 is a schematic perspective view illustrating the shielding device of the thin-film-deposition equipment which is in the shielding state, according to one embodiment of the present disclosure.

Referring to FIG. 2 and FIG. 3, the shielding device 100 includes a first-shield member 151 and a second-shield member 153 and a driver 17, wherein the first-shield member 151 and the second-shield member 153 are positioned the containing space 12. The driver 17 interconnects the first-shield member 151 and the second-shield member 153, and drives, swings the first-shield member 151 and the second-shield member 153 in opposite angular directions, such as to have the first-shield member 151 and the second-shield member 153 swaying toward or away from each other synchronously, about an axle of the driver 17.

In one embodiment of the present disclosure, the driver 17 interconnects the first-shield member 151 and the second-shield member 153, via a first-connecting arm 141 and a second-connecting arm 143 respectively. Such that, the driver 17 swings the first-connecting arm 141 and the second-connecting arm 143, to further respectively move the first-shield member 151 and the second-shield member 153, in the opposite directions.

The first-shield member 151 and the second-shield member 153 may be formed as plates with similar shapes, such as respectively formed as one half and another half of a round plate. Such that, as the driver 17 swings the first-shield member 151 and the second-shield member 153 toward each other, the two members 151, 153 come together and form a whole round shield 15, for covering and shielding the carrier 13 and/or the substrate 163.

In this embodiment, the first-shield member 151 and the second-shield member 153 can be operated to move into a shielding state, which is defined as the first-shield member 151 and the second-shield member 153 continue to approach each other, until a distance between the two members 151, 153 is less than a threshold value, such as 1 millimeter (mm). To be specific, the first-shield member 151 and the second-shield member 153 do not actually contact each other but keep a gap space therebetween, such that to avoid a collision or friction therebetween, which may create some wear-off particles therefrom to pollute the containing space 12 of the reaction chamber 110 and/or the carrier 13 therein.

However, with the abovementioned structure, a gap space 254 (FIG. 11) remains between the first-shield member 151 and the second-shield member 153, which may still allow a plasma or pollutants created during a cleaning process to pass and then to pollute the carrier 13 and/or the substrate 163 thereon, during the cleaning process. Therefore, in one embodiment of the present disclosure, the first-shield member 151 and the second-shield member 153 may be disposed in different heights, such as to have the first-shield member 151 positioned higher than the second-shield member 153. With such configuration, when the first-shield member 151 and the second-shield member 153 are operated to move into the shielding state, the two shield members 151, 153 can partially overlap for a full coverage.

The first-shield member 151 and the second-shield member 153 formed with similar, half-round shapes and area sizes, which is merely one embodiment of the present disclosure, therefore claim scope of the present disclosure is not limited thereto. In practical use, the first-shield member 151 and the second-shield member 153 may be formed with different area sizes and shapes, such rectangular plates, ellipse plates or plates in any other geometric shape, moreover, the first-shield member 151 may have an area size larger than that of the second-shield member 153. What is essential for the claim scope of the present disclosure is that, two shield members which can approach each other to form a whole shield for covering the carrier and/or substrate thereon.

Figure 10:
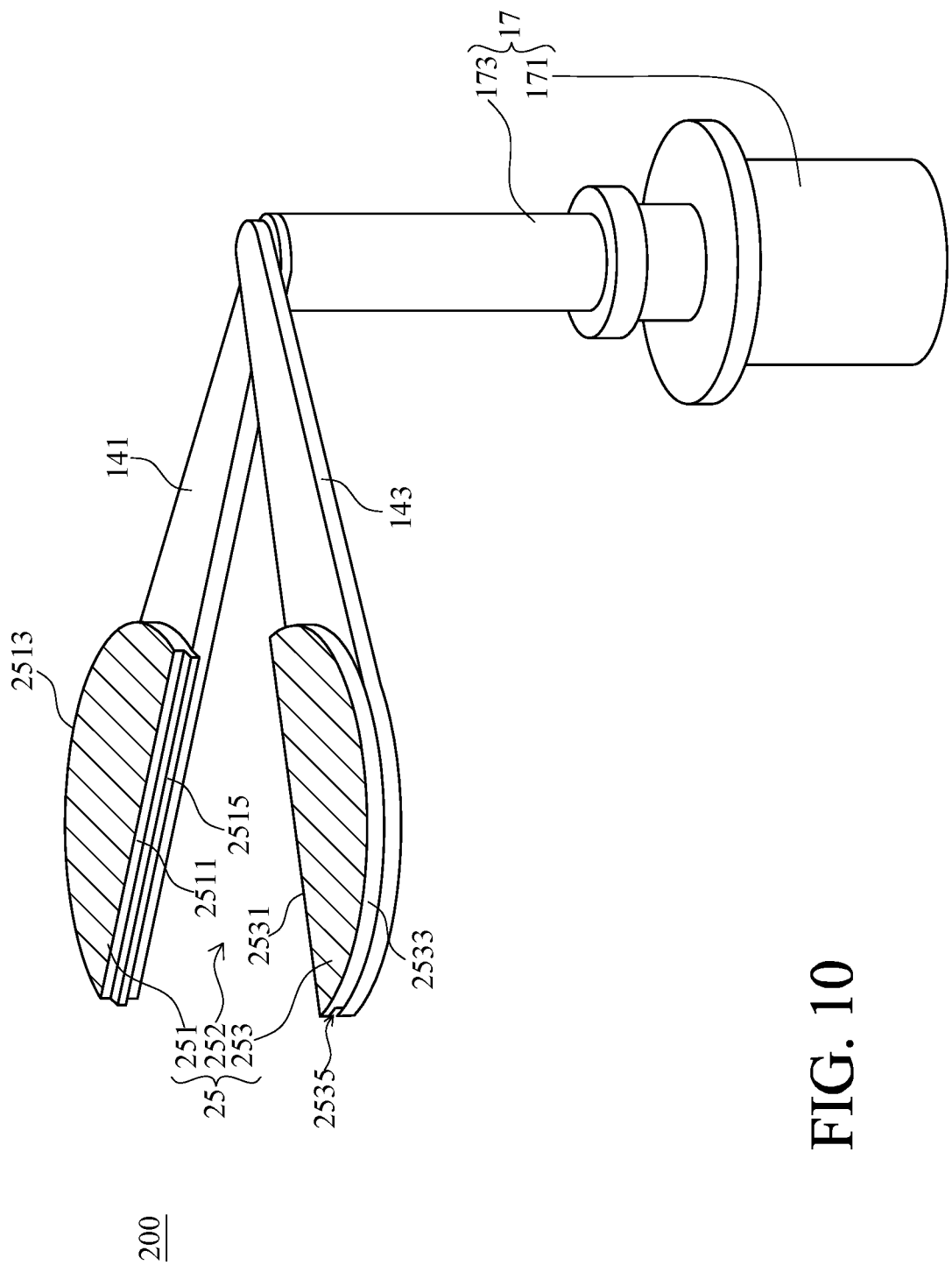
FIG. 10 is a schematic perspective view illustrating the shielding device of the thin-film-deposition equipment which is in the open state, according to another embodiment of the present disclosure.

For this embodiment, the first-shield member 151 and the second-shield member 153 are both formed as half-round plates, each of the shield member 151, 153 is formed with a straight, flat inner-edge surface (similar to a first-inner-edge surface 2511 and a second-inner-edge surface 2531 in an embodiment of FIG. 10), and also formed with a curved outer-edge surface (similar to a first-outer-edge surface 2531 and a second-outer-edge surface 2533 in the embodiment of FIG. 10). Moreover, the inner-edge surface of the first-shield member 151 and the inner-edge surface of the second-shield member 153 correspond to each other. When the driver 17 drives and swings the first-shield member 151 and the second-shield member 153 to approach each other, the two shield members 151, 153 come together and form the whole round shield 15, also to have the two inner-edge surfaces thereof facing each other. However, the claim scope of the present disclosure is not limited to such straight and flat inner-edge surfaces of the shield members 151, 253, in practical use, the inner-edge surfaces may be formed in concave and convex shapes or zig-zag shapes corresponding to each other, it is only sufficient to have the inner-edge surfaces of the two shield members to approach and be adjacent to each other, for effectively cover the carrier 13.

Moreover, in a different embodiment of the present disclosure, the inner-edge surface of the first-shield member 151 may be configured to incline related to a top surface (upside of FIG. 2) or a bottom surface (downside of FIG. 2)

of the first-shield member 151. In the other hand, the inner-edge surface of the second-shield member 153 may also be configured to incline related to a top surface (upside of FIG. 2) or a bottom surface (downside of FIG. 2) of the second-shield member 153. Also, the inner-edge surface of the first-shield member 151 and the inner-edge surface of the first-shield member 151 are formed substantially parallel and corresponding to each other, such that when the two shield members 151, 153 are in the shielding state, the gap space is formed in an inclined manner, which can be effective for blocking the pollutants falling vertically downward.

Figure 4:
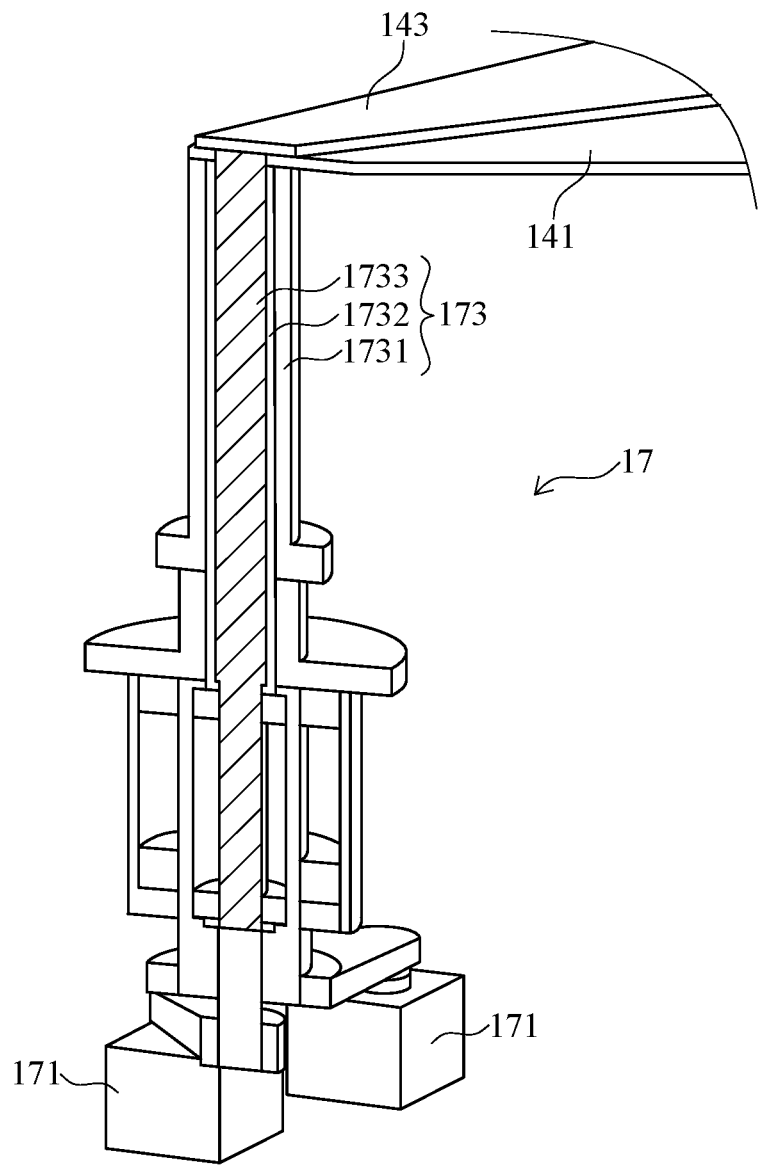
FIG. 4 is a schematic perspective sectional view illustrating a driver of the shielding device, according to one embodiment of the present disclosure.

In one embodiment of the present disclosure as shown in FIG. 4, the driver 17 includes at least one motor 171 and a shaft seal 173, wherein the motor 171 is connected to the first-shield member 151 and the second-shield member 153 via the shaft seal 173. The motor 171 is positioned outside of the containing space 12 within the reaction chamber 110. The shaft seal 173 extends from the motor 171 and into the reaction chamber 110, and hence partially disposed within the containing space 12.

Specifically, the shaft seal 173 includes an outer tube 1731 and an inner shaft 1733. The outer tube 1731 has an inner space 1732 for containing the inner shaft 1733, wherein the outer tube 1731 and the inner shaft 1733 are disposed concentrically. Moreover, the outer tube 1731 and the inner shaft 1733 can be driven by the motor 171 to rotate relative to each other. The outer tube 1731 is connected to the first-connecting arm 141, and such that able to swing the first-shield member 151 to hence move the first-connecting arm 141. The inner shaft 1733 is connected to the second-connecting arm 143, and such that able to swing the second-shield member 153 to hence move the second-connecting arm 143.

The shaft seal 173 may be a common shaft seal component, which is mainly for isolating the containing space 12 of the reaction chamber 110 from an outside thereof and maintaining a vacuum condition within the containing space 12. In a different embodiment of the present disclosure, the shaft seal 173 may be a magnetic liquid rotary sealing, which includes a plurality of bearings, at least one permanent magnet, at least one pole piece and at least one ferrofluid. For example, the bearings may be disposed within the outer tube 1731 and surround an outer surface the inner shaft 1733, such that to facilitate the relative rotation of the inner shaft 1733 and the outer tube 1731. The permanent magnet is disposed on an inner surface of the outer tube 1731 and between two bearings. Moreover, two annular pole pieces are also disposed on the inner surface of the outer tube 1731, and each of the pole pieces is positioned between the permanent magnet and one of the bearings respectively. Furthermore, the inner shaft 1733 may be formed with two groove portions, the pole pieces are disposed to respectively surround groove portions of the inner shaft 1733, also with the ferrofluid disposed between the groove portions and the pole pieces. It should be noted that the shaft seal 173 as a magnetic liquid rotary sealing, which is merely one embodiment of the present disclosure, therefore which does not limit the claim scope of the present disclosure.

In one embodiment of the present disclosure as shown in FIG. 4, the motor 171 may be two respectively connected to the outer tube 1731 and the inner shaft 1733 of the shaft seal 173, to drive the outer tube 1731 and the inner shaft 1733 to rotate in opposite directions, such that to swing the first-shield member 151 and the second-shield member 153 in the opposite directions via the outer tube 1731 and the inner shaft 1733.

In a different embodiment of the present disclosure, the motor 171 may be just one with a drive mechanism (e.g. gear system or linkage system, etc.), such that to drive, swing the first-connecting arm 141 and the second-connecting arm 143 and to further move the first-shield member 151 and the second-shield member 153 in the opposite directions.

Figure 6:
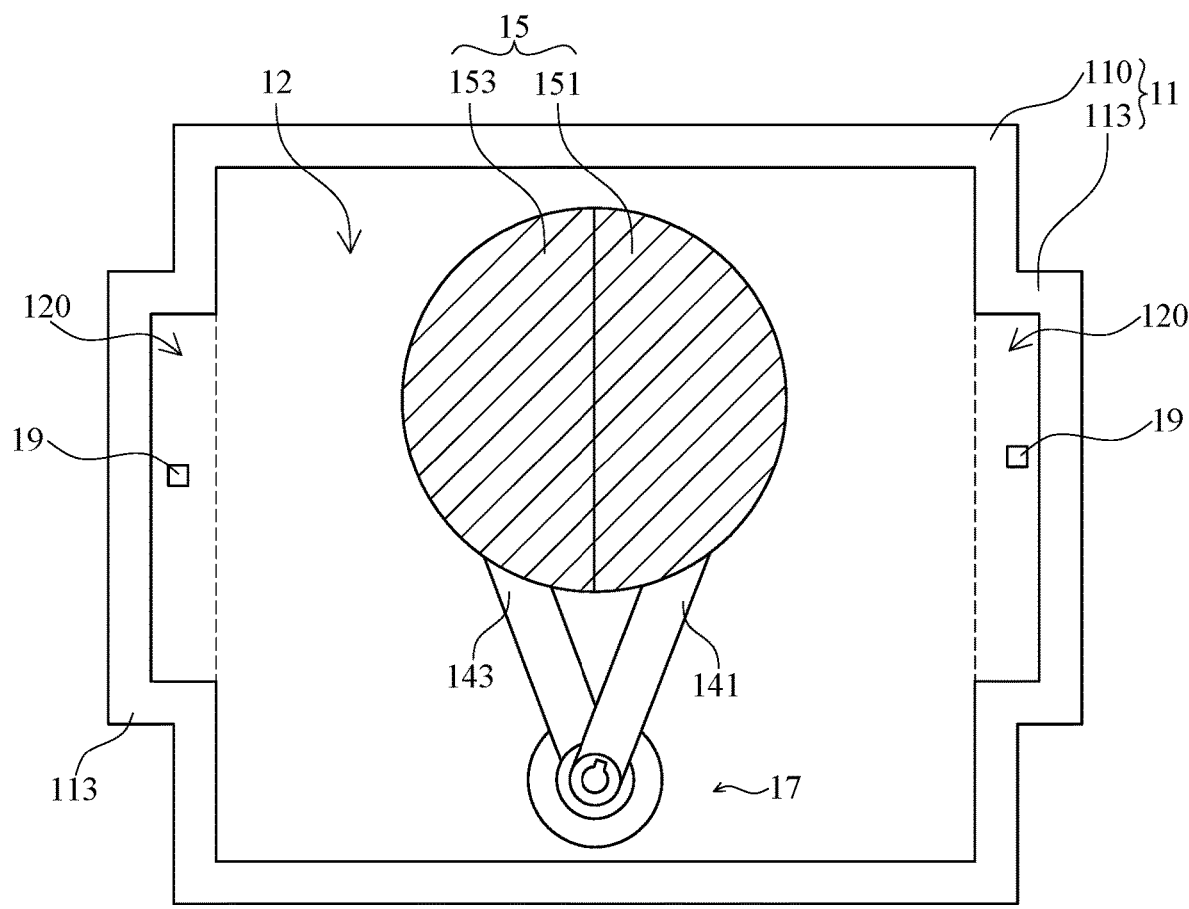
FIG. 6 is a schematic top view illustrating the shielding device of the thin-film-deposition equipment which in the shielding state, according to one embodiment of the present disclosure.

In more detail, Thin-film-deposition equipment 10 and/or the shielding device 100 according to the present disclosure, which can be operated to switch between two states as an open state and a shielding state. As shown in FIG. 2 and FIG. 6, the driver 17 can drive, swing the first-shield member 151 and the second-shield member 153 to move in the opposite directions, such that the first-shield member 151 and the second-shield member 153 leave each other and move into the open state. In the open state, the first-shield member 151 and the second-shield member 153 have an open space 152 therebetween, such that the first-shield member 151 and the second-shield member 153 do not get between the target material 161 and the carrier 13 with the substrate 163 thereon.

Moreover, when the two shield members 151, 153 are operated into the open state, a small portion of the first-shield member 151 and a small portion of the second-shield member 153 respectively enter the sensing spaces 120 of the two sensor areas 113, which are fluidly and spatially connected to the containing space 120. Also to mention that, in the open state, a relatively large portion of the first-shield member 151 and a relatively large portion of the second-shield member 153 still remain within the containing 12.

In a different embodiment of the present disclosure as shown in FIG. 1, the containing space 12 of the reaction chamber 110 may be disposed with a tubular blocking member 111, which has one end connected to the ceiling surface of the reaction chamber 110, and another end formed with an opening 112. Such that, when the carrier 13 approaches the target material 161, the carrier 13 also enters the opening 112 or contacts the blocking 111. The reaction chamber 110, the carrier 13 and the blocking member 111 together define a reactive space within the containing space 12, for forming the thin film on the substrate 163 within the reactive space, such that to prevent the blew-off particles of the target material 161 from spreading out of the reactive space and forming undesired thin film outside.

In the opposite manner, as shown in FIG. 3 and FIG. 6, the driver 17 can drive, swing the first-shield member 151 and the second-shield member 153 to approach each other and move into the shielding state. In the shielding state, the first-shield member 151 and the second-shield member 153 come together and form the whole shield 15 between the target material 161 and the carrier 13, such that to cover and shield the carrier 13 from the target material 161.

As shown in FIG. 1, the shield 15 and the blocking member 111 together can define a cleaning space 121 within the containing space 12, wherein the cleaning space 121 and the aforementioned reactive space have partially or completely spatial overlap. A burn-in process may be performed within the cleaning space 121, to clean the target material 161, the ceiling surface of the reaction chamber 110 and/or an inside of the blocking member 111, and to remove oxides, nitrides or other pollutants on the target material 161, also to remove undesired, waste thin film within the reaction chamber 110 and/or the blocking member 111.

Furthermore, during the process of cleaning the thin-film-deposition equipment 10, the carrier 13 and/or the substrate 163 are covered, protected by the shield 15, thereby to prevent the pollutants created during the cleaning process from turning to deposit and pollute surface of the carrier 13 and/or the substrate 163.

In further detail, the present disclosure separates the shield 15 into the two shield members 151, 153, and carries the first-shield member 151 and the second-shield member 153 respectively via the first-connecting arm 141 and the second-connecting arm 143, such that to each of the connecting arms 141, 143 only needs to bear half weight of the shield 15.

The two connecting arms 141, 143 may be configured to carry thicker and heavier shield members 151, 153, which are durable against thermal deformation caused by high temperature, and which can hence prevent plasma or pollutant created during the cleaning process from sneaking through and contacting the carrier 13 or the substrate 163 below, with a higher reliability.

Also, as the shield 15 split into two shield members 151, 153, this can help to reduce, minimize spaces for storing the two shield members 151, 153 in the open state, such that to improve a space efficiency of the reaction chamber 110.

Figure 5:
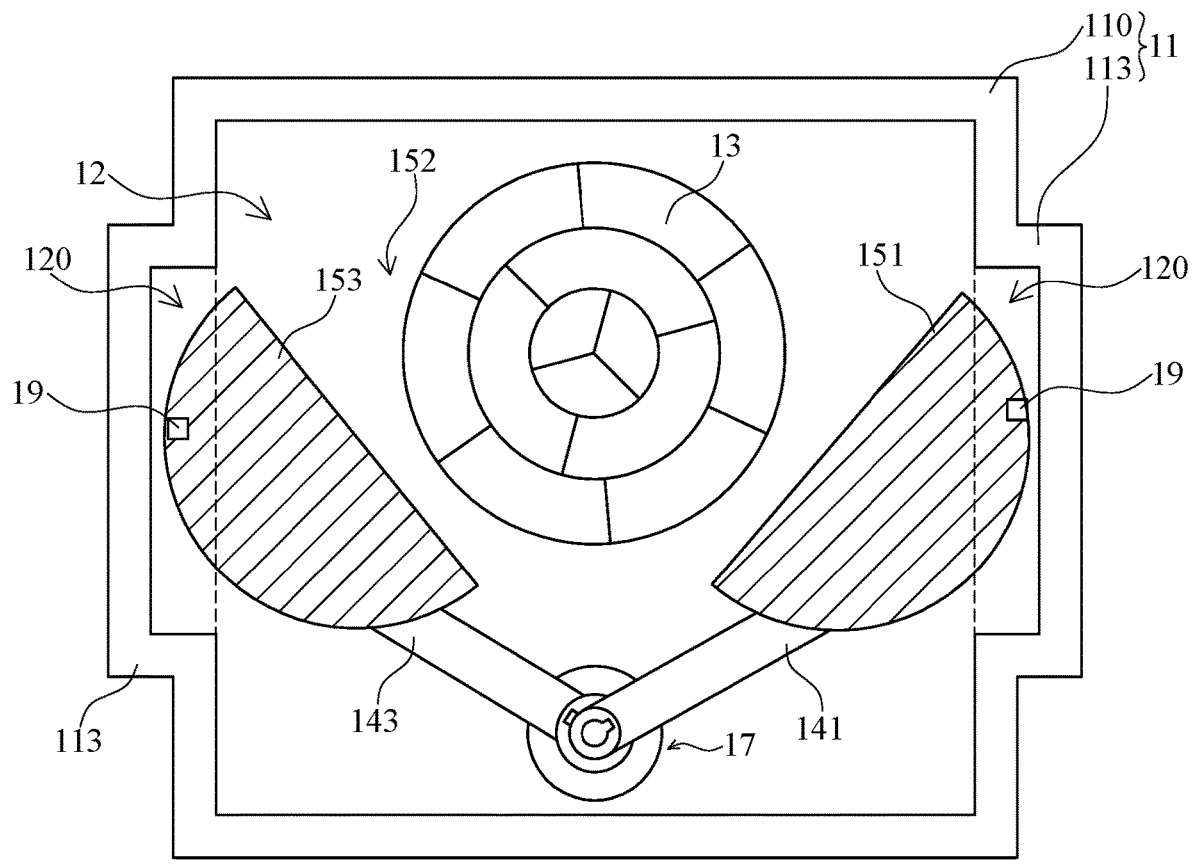
FIG. 5 is a schematic top view illustrating the shielding device of the thin-film-deposition equipment which in the open state, according to one embodiment of the present disclosure.
Figure 7:
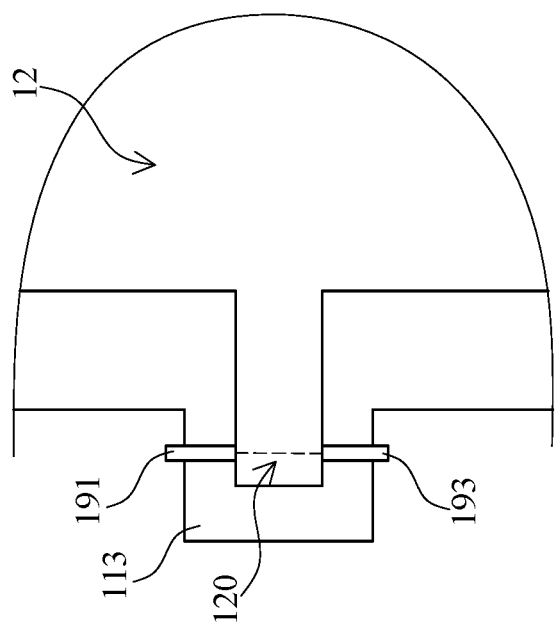
FIG. 7 is a schematic fragmentary sectional view illustrating the shielding device of the thin-film-deposition equipment which is in the open state, according to one embodiment of the present disclosure.

In on embodiment of the present disclosure, as shown in FIG. 5 and FIG. 6, the reaction chamber 110 may be formed with a cubic appearance and a rectangular cross-section, and the two sensor areas 113 are respectively mounted on two opposite sides of the reaction chamber 110. As shown in FIG. 5 and FIG. 7, when the shield members 151, 153 are operated into the open state, the first-shield member 151 and the second-shield member 153 are partially and respectively positioned within the sensing spaces 120 of the two sensor areas 113.

In on embodiment of the present disclosure, each of the two sensor areas 113 is disposed with the least one position sensor 19, for respectively detecting the first-shield member 151 and the second-shield member 153 entering the sensing spaces 120. The position sensors 19 are configured to confirm that the first-shield member 151 and the second-shield member 153 are in the open state, when the position sensors 19 detected that the two shield members 151, 153 within the sensing spaces 120. As the position sensors 19 confirmed the open state the shield members 151, 153, the carrier 13 with the substrate 163 thereon is driven by an elevating unit (not shown), to approach the target material 161. Thereafter, a process gas (e.g. noble gas) is energized to bombard the target material 161, such that some blew-off particles of the target material 161 fall and be deposited on the substrate 163 to form a thin film thereon.

If the carrier 13 moves to approach the target material 161 when the first-shield member 151 and the second-shield member 153 have not yet move into the open state, a collision may occur between the carrier 13 and the first-shield member 151 and the second-shield member 153, and thereby to cause damage to the carrier 13, the first-shield member 151 or the second-shield member 153.

In practical use, the sensor areas 113 may be formed as extension chambers of the reaction chamber 110, wherein the each of sensor areas 113 has a height shorter than that of the reaction chamber 110. Such that, the sensor areas 113 are relatively thinner than the reaction chamber 110 in an up-down direction as shown in FIG. 1, the sensing spaces 120 thereof are also formed relative narrow. In more detail, each of the sensor areas 113 has two opposite surfaces, such as an upper surface (upside of FIG. 1) and a lower surface (downside of FIG. 1). Each of the position sensors 19 may include an emitter 191 and a receiver 193 respectively disposed on the opposite surfaces of each of the sensor areas 113, to have the receiver 193 able to receive a signal emitted from the emitter 191. Also, the position sensors 19 may be optical sensors. Also to mention that, by virtue of such relative short and thin sensor areas 113, the emitter 191 and the receiver 193 of the position sensors 19 can be relatively easy to mount into the sensor areas 113 from outside.

As shown in FIG. 7, when the two shield members 151, 153 are operated into the open state and respectively enter the sensing spaces 120 of the two sensor areas 113, each of the shield members 151, 153 respectively blocks the signal from the emitter 191 and cause the receiver 193 unable to receive the signal, in such manner to confirm that the shield members 151, 153 are in the open state.

Figure 8:
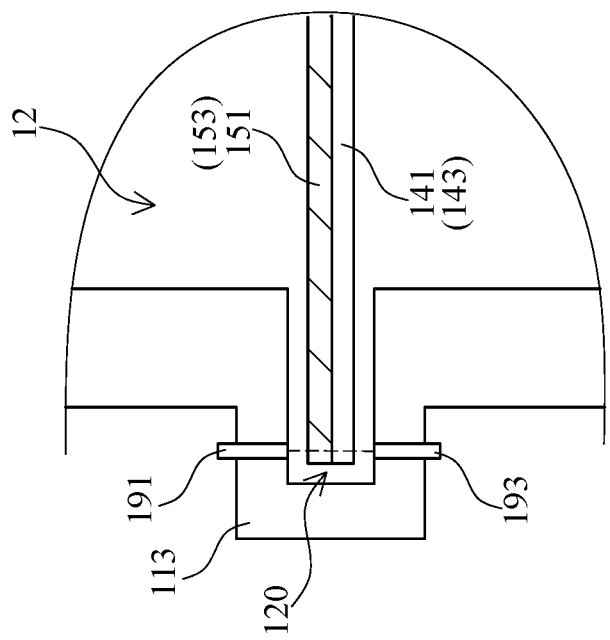
FIG. 8 is a schematic fragmentary sectional view illustrating the shielding device of the thin-film-deposition equipment which leaves a sensor area, according to one embodiment of the present disclosure.

In an opposite manner as shown in FIG. 6 and FIG. 8, when the two shield members 151, 153 are operated into the shielding state, each of which 151, 153 all leaves the sensing spaces 120, such that, the receiver 193 is able to receive the signal of the emitter 191 and hence to confirm the two shield members 151, 153 are not in the open state. At this moment, the carrier is not permitted to move toward the target material 161, thereby to prevent the collision between the carrier 13 and the shield members 151, 153, or even the damage thereof.

Figure 9:
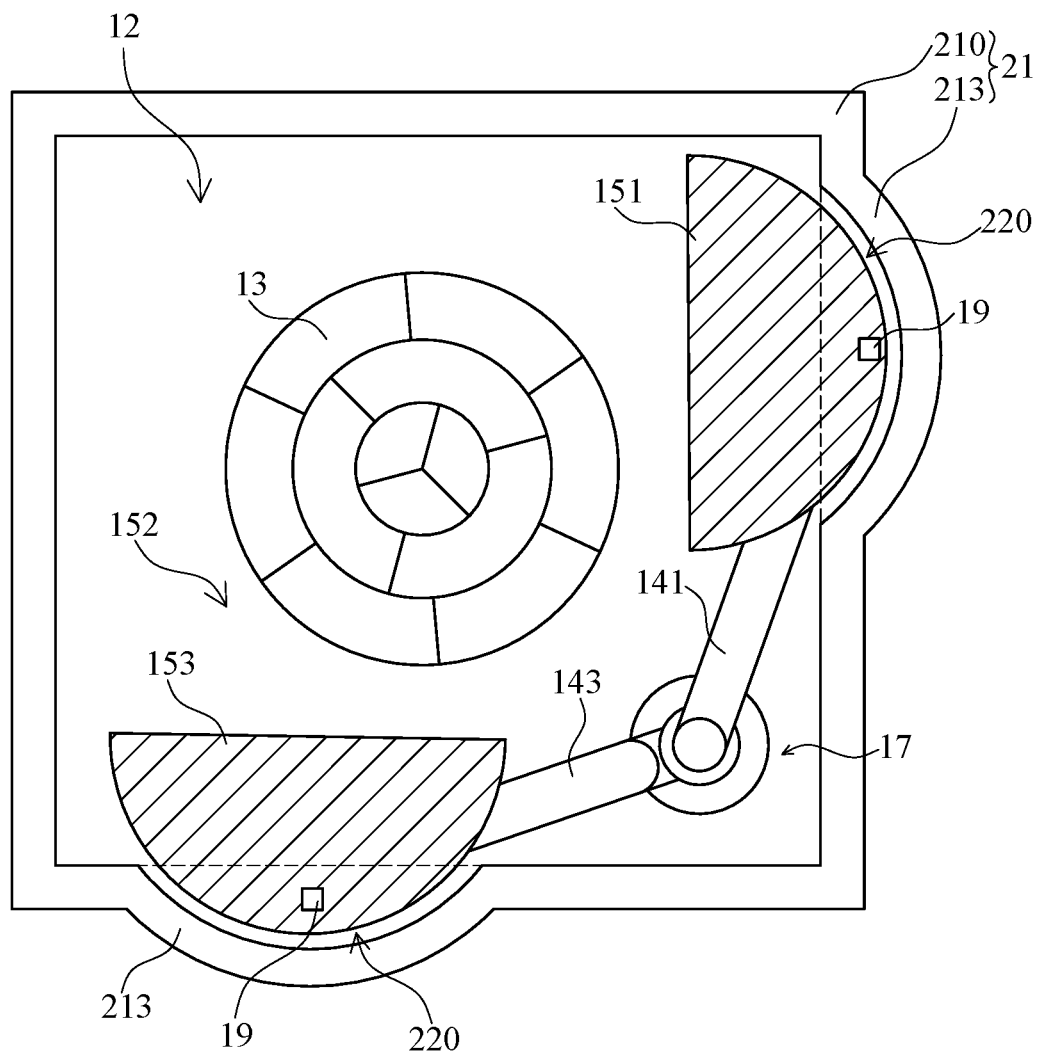
FIG. 9 is a schematic top view illustrating the shielding device of the thin-film-deposition equipment which in is the open state, according to a different embodiment of the present disclosure.

In practical use, according to how the other components, mechanisms and movements thereof in the thin-film-deposition equipment 10 are arranged, the shielding device 100 may be disposed at different locations within the reaction chamber 110. For example, as shown in FIG. 9, the driver 17 of the shielding device 100 of the thin-film-deposition equipment 20 may be disposed on or near by a corner of the reaction chamber 210/or the containing space 12, also, the two sensor areas 213 are disposed, mounted on two adjacent edge sides of the cubic reaction chamber 210, such that the reaction chamber 110 can be further disposed with passages or gas-extraction pipelines at edge sides thereof.

Figure 11:
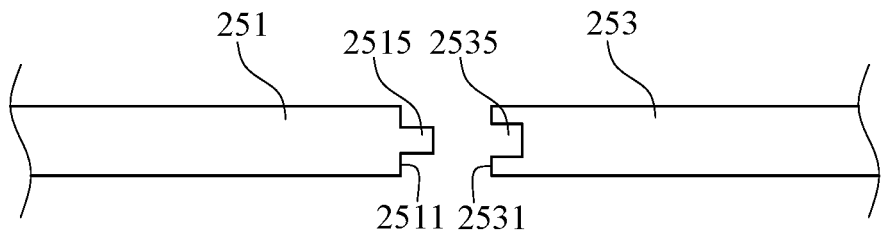
FIG. 11 is a schematic fragmentary sectional view illustrating a first-shield member and a second-shield member of the shielding device which are separate from each other, according to another embodiment of the present disclosure.
Figure 12:
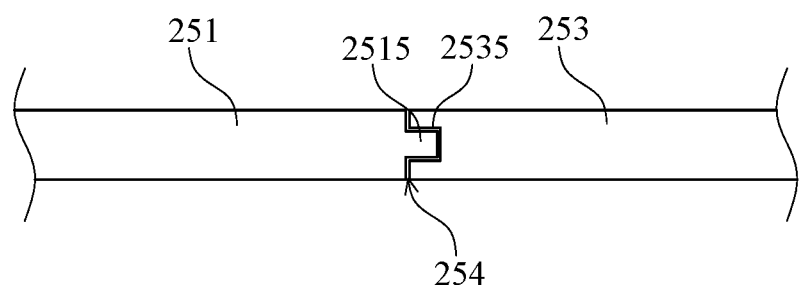
FIG. 12 is a schematic fragmentary sectional view illustrating the first-shield member and the second-shield member of the shielding device which are in the shielding state, according to another embodiment of the present disclosure.

Referring to FIG. 10~FIG. 12, wherein FIG. 10 is a schematic perspective view illustrating the shielding device 200 of the thin-film-deposition equipment which is in the open state, FIG. 11 is a schematic fragmentary sectional view illustrating the first-shield member 251 and the second-shield member 253 of the shielding device 200 which are separate from each other, and FIG. 12 is a schematic fragmentary sectional view illustrating the first-shield member 251 and the second-shield member 253 of the shielding device 200 which are in the shielding state, according to another embodiment of the present disclosure. The shielding device 200 in this embodiment is similar to that in aforementioned embodiments, but different in structures of the first-shield member 251 and the second-shield member 253. The first-shield member 251 has at least one protrusion 2515 formed on the first-inner-edge surface 2511, in the other hand, the second-shield member 253 has at least one cavity 2535 formed on the second-inner-edge surface 2531. Furthermore, the protrusion 2515 on the first-inner-edge surface 2511 corresponds to the cavity 2535 on the second-inner-edge surface 2531, and the protrusion 2515 is formed slightly smaller than the cavity 2535.

Figure 13:
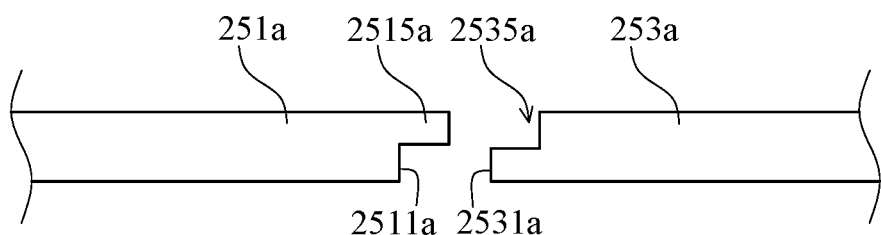
FIG. 13 is a schematic fragmentary sectional view illustrating the first-shield member and the second-shield member which are separate from each other, according to another different embodiment of the present disclosure.

As shown in FIG. 11 and FIG. 12, the protrusion 2515 is positioned at middle of the first-inner-edge surface 2511 on the first-shield member 251, the cavity 2535 is also positioned at middle of the second-inner-edge surface 2531 on the second-shield member 253. However, in another different embodiment as shown in FIG. 13, the protrusion 2515*a* may be positioned at an upper portion of the first-inner-edge surface 2511*a* of the first-shield member 251*a*, and the cavity 2535*a* may also be positioned at a upper portion of the second-inner-edge surface 2531*a*.

As shown in FIG. 12, in this embodiment, when the first-shield member 251 and the second-shield member 253 are operated in the shielding state, between the first-shield member 251 and the second-shield member 253, the first-inner-edge surface 2511 and the second-inner-edge surface 2531 are adjacent to each other and maintain the gap space 254, furthermore, the protrusion 2515 on the first-inner-edge surface 2511 enters the cavity 2535 on the second-inner-edge surface 2531 but still maintain the gap space 254 therebetween.

Similar to the aforementioned embodiment, the gap space 254 between the first-inner-edge surface 2511 and the second-inner-edge surface 2531 is configured less than the aforementioned threshold value, such as 1 mm. Thereby, the first-shield member 251 and the second-shield member 253 do not contact each other, nor the protrusion 2515 and the cavity 2535 thereon, in order prevent the collision or friction therebetween.

Figure 14:
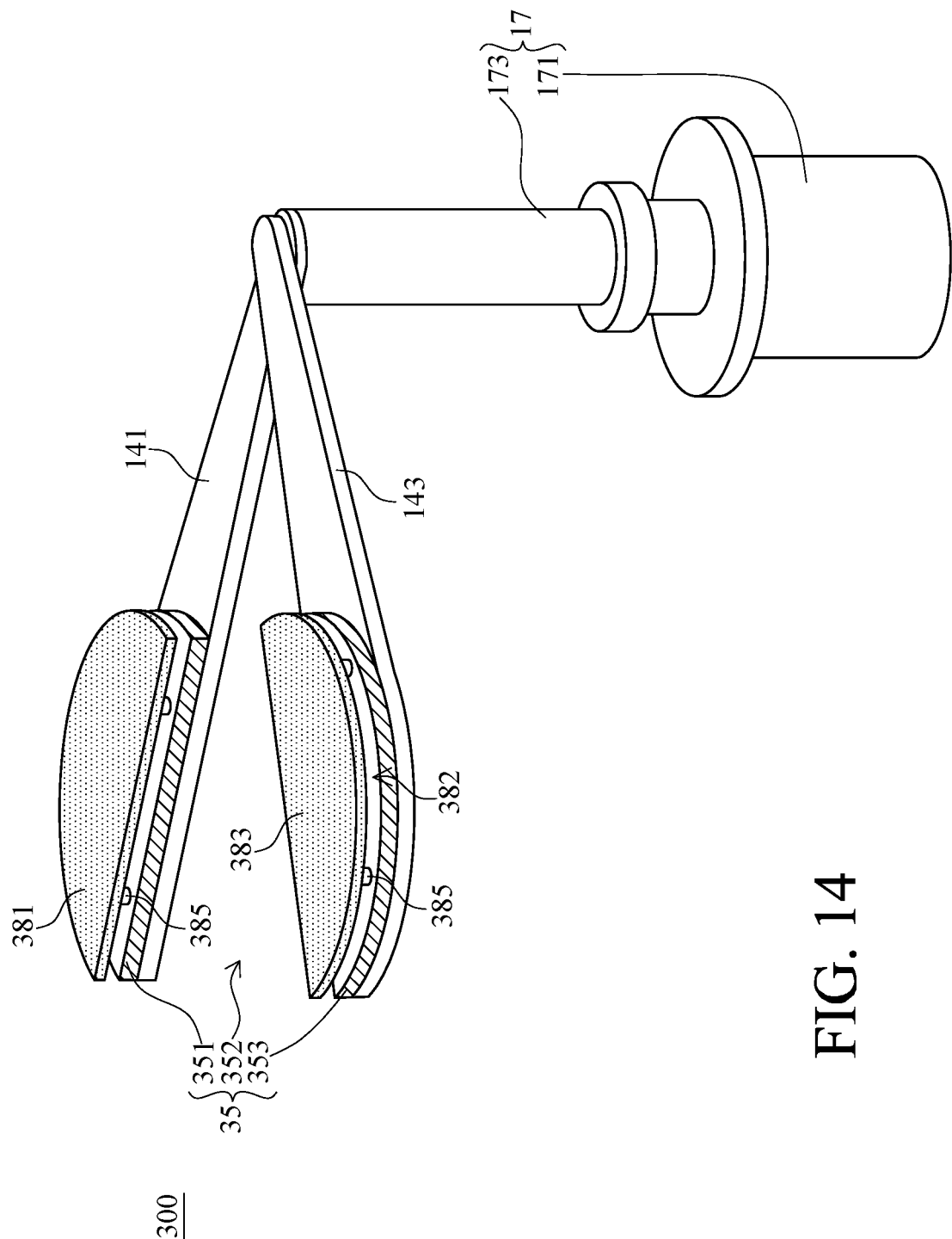
FIG. 14 is a schematic perspective view illustrating the shielding device of the thin-film-deposition equipment which is in the open state, according to yet another embodiment of the present disclosure.
Figure 15:
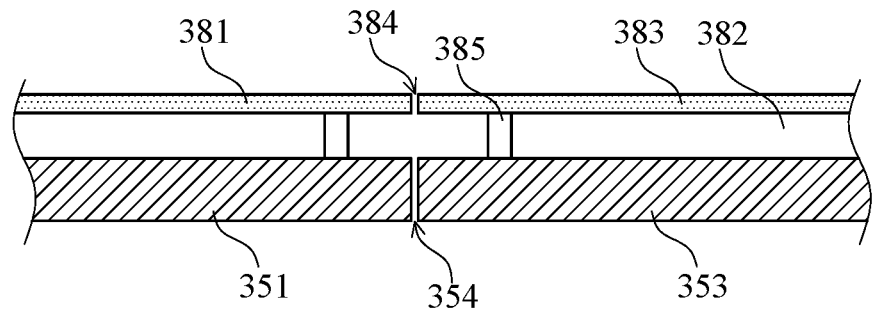
FIG. 15 is a schematic fragmentary sectional view illustrating the first-shield member and the second-shield member of the shielding device which are in the shielding state, according to yet another embodiment of the present disclosure.

Also, similar to the aforementioned embodiment, the first-shield member 251 and the second-shield member 253 are formed as half-round plates, with straight and flat inner-edge surfaces 2511, 2531. However, the present disclosure is mot limited thereto, in other embodiment, the inner-edge surfaces may be formed in concave and convex shapes or zig-zag shapes, or even inclined planes but still corresponding to each other, Referring to FIG. 14 and FIG. 15, wherein FIG. 14 is a schematic perspective view illustrating the shielding device of the thin-film-deposition equipment which is in the open state, and FIG. 15 is a schematic fragmentary sectional view illustrating the first-shield member and the second-shield member of the shielding device which are in the shielding state, according to yet another embodiment of the present disclosure. In comparison with the aforementioned embodiments, the shielding device 300 in this embodiment, which includes a first-guard plate 381 and a second-guard plate 383 respectively disposed on the first-shield member 351 and the second-shield member 353. With such structure, as the driver 17 drives, swings the connecting arms 341, 343 to move second-shield members 351, 353 toward each other into the shielding state, the first-guard plate 381 and the second-guard plate 383 also come together to get between the shield members 351, 353 and the target material 161, to provide further coverage and protection for the shield members 351, 353.

The guard plates 381, 383 mainly serve to block the high-temperature matters or the heat created during the process of cleaning the reaction chamber 110 and the target material 161, from directly contacting the shield members 351, 353, such that to prevent thermal deformation and malicious effect occurring thereto.

Also to mention that, when the shield members 351, 353 are in the shielding state, the guard plates 381, 383 do not contact each other neither, in order to avoid a collision or friction therebetween from creating wear-off particles and hence to pollute the containing space 12 and/or the carrier 13 within the reaction chamber 110. Such that, as shown in FIG. 15, when the shield members 351, 353 are in the shielding state, the shield members 351, 353 maintain a first gap space 354 therebetween, the guard plates 381, 383 also maintain a second gap space 384 therebetween, wherein first gap space 354 and second the gap space 384 have some spatial overlap, in this embodiment. Moreover, the first-shield member 351 and the first-guard plate 381 both may be formed with similar half-round shapes and area sizes, and so do the second-shield member 353 and the second-guard plate 383.

In one embodiment of the present disclosure, the guard plates 381, 383 are connected to the shield members 351, 353 via a plurality of support units 385, and thereby a gap 382 is respectively formed between the first-guard plate 381 and the first-shield member 351, and between the second-guard plate 383 and the second-shield member 353. The gaps 382 can serve prevent the high temperature generated during the cleaning process from directly transferring from the guard plates 381, 383 into the shield members 351, 353, such that to further prevent the thermal deformation of the shield members 351, 353.

Figure 16:
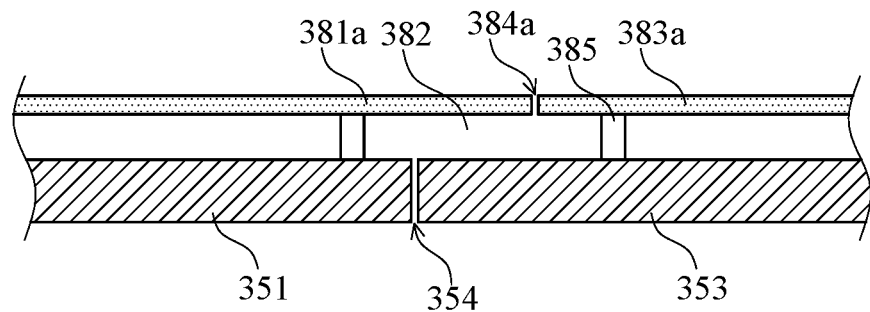
FIG. 16 is a schematic fragmentary sectional view illustrating the first-shield member and the second-shield member of the shielding device which are in the shielding state, according to another different embodiment of the present disclosure.

In yet another embodiment of the present disclosure, as shown in FIG. 16, the guard plates 381a, 383a and the shield members 351, 353 may be configured to have the first gap space 354a and the second gap space 384a not spatially overlap each other. In this embodiment, the two shield members 351, 353 have substantially identical area sizes, whereas the two guard plates 381a, 383a have different area sizes, such as the first-guard plate 381a may be formed larger than the second-guard plate 383a. However surely, in practical use, it may also be configured into an opposite manner, such as the two shield members 351, 353 have different area sizes, whereas the two guard plates 381a, 383a have substantially identical area sizes, which makes no spatial overlap between the first gap space 354a and the second gap space 384a as well.

When the first gap space 354 has no spatial overlap with the second gap space 384, the high-temperature matters and the heat of the cleaning process is prevented from directly passing through the second gap space 384 then the first gap space 354, and then to reach the carrier 13, thereby to improve the coverage for the carrier 13 and/or the substrate 163.

Figure 17:
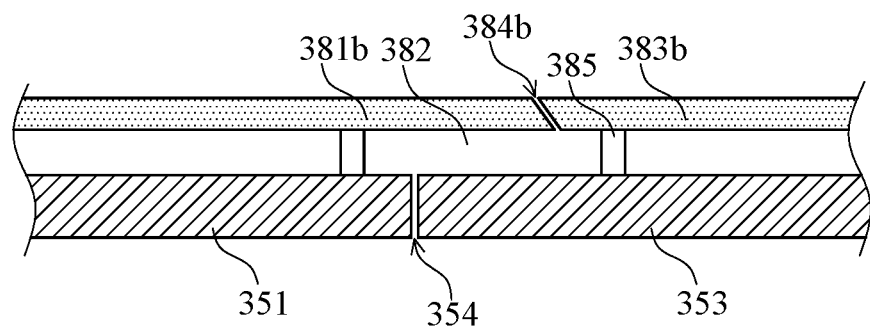
FIG. 17 is a schematic fragmentary sectional view illustrating the first-shield member and the second-shield member of the shielding device which are in the shielding state, according to yet another different embodiment of the present disclosure.
Figure 18:
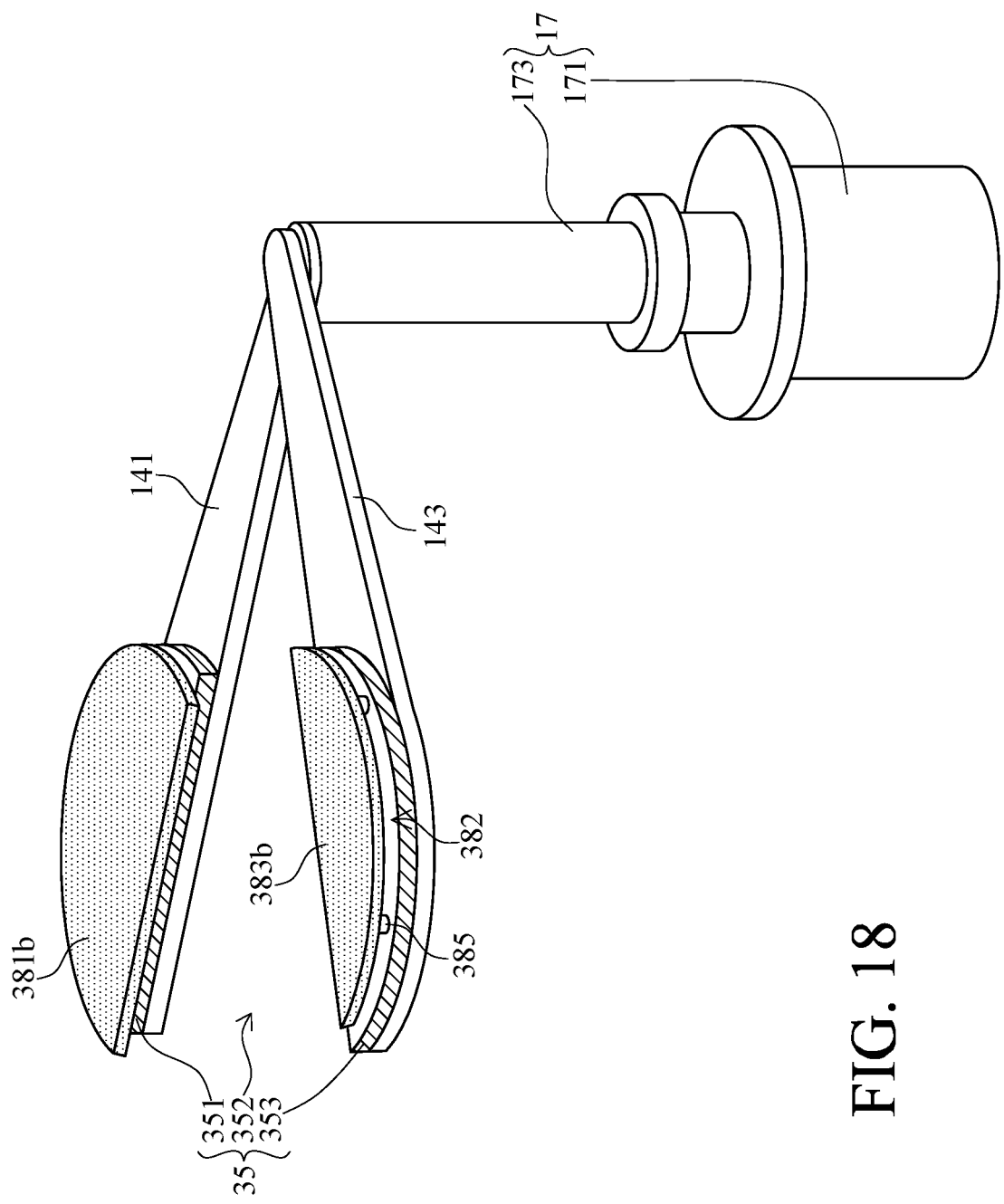
FIG. 18 is a schematic perspective view illustrating the shielding device of the thin-film-deposition equipment which is in the open state, according to yet another different embodiment of the present disclosure.

As shown in FIG. 17 and FIG. 18, in another different embodiment of the present disclosure, similar to the two shield members 351, 353, the two guard plates 381b, 383b respectively have inner-edge surfaces facing and corresponding each other, wherein the inner-edge surfaces of the two guard plates 381b, 383b may be formed in an inclined manner and substantially parallel to each other. Such that, when in the shielding state, the second gap space 384b formed between the two guard plates 381b, 383b, which inclines related to the first gap space 354 between the two shield members 351, 353, such that to tilt away from the second gap space 384b for preventing the pollutant from passing through and entering the first gap space 354, in a more effective manner. Surely, in other different embodiment, the two shield members 351, 353 may also be configured to have the inner surfaces thereof formed in the inclined, substantially parallel manner, such that to tilt, orient both the first gap space and the second gap space, for a further effective performance against the falling pollutants.

In one embodiment of the present disclosure similar to the aforementioned one, along with the first-shield member 351 and the second-shield member 353 that are positioned in different heights, the first-guard plate 181 and the second-guard plate 183 can also be disposed in different heights, such as to have the first-shield member 351 positioned higher than the second-shield member 353, with the first-guard plate 381 also positioned higher than the second-guard plate 383. Such that, when in the shielding state, the first-shield member 351 partially covers top of the second-shield member 353 and hence overlaps therewith, the first-guard plate 381 also partially covers a top of the second-guard plate 183 and overlaps therewith, thereby to improve the coverage for the carrier 13 and/or the substrate 163.

Surely, along with the shield members 351, 353 that may be formed in different shapes, the guard plates 381, 383 may also be formed in any geometric shapes.

Figure 19:
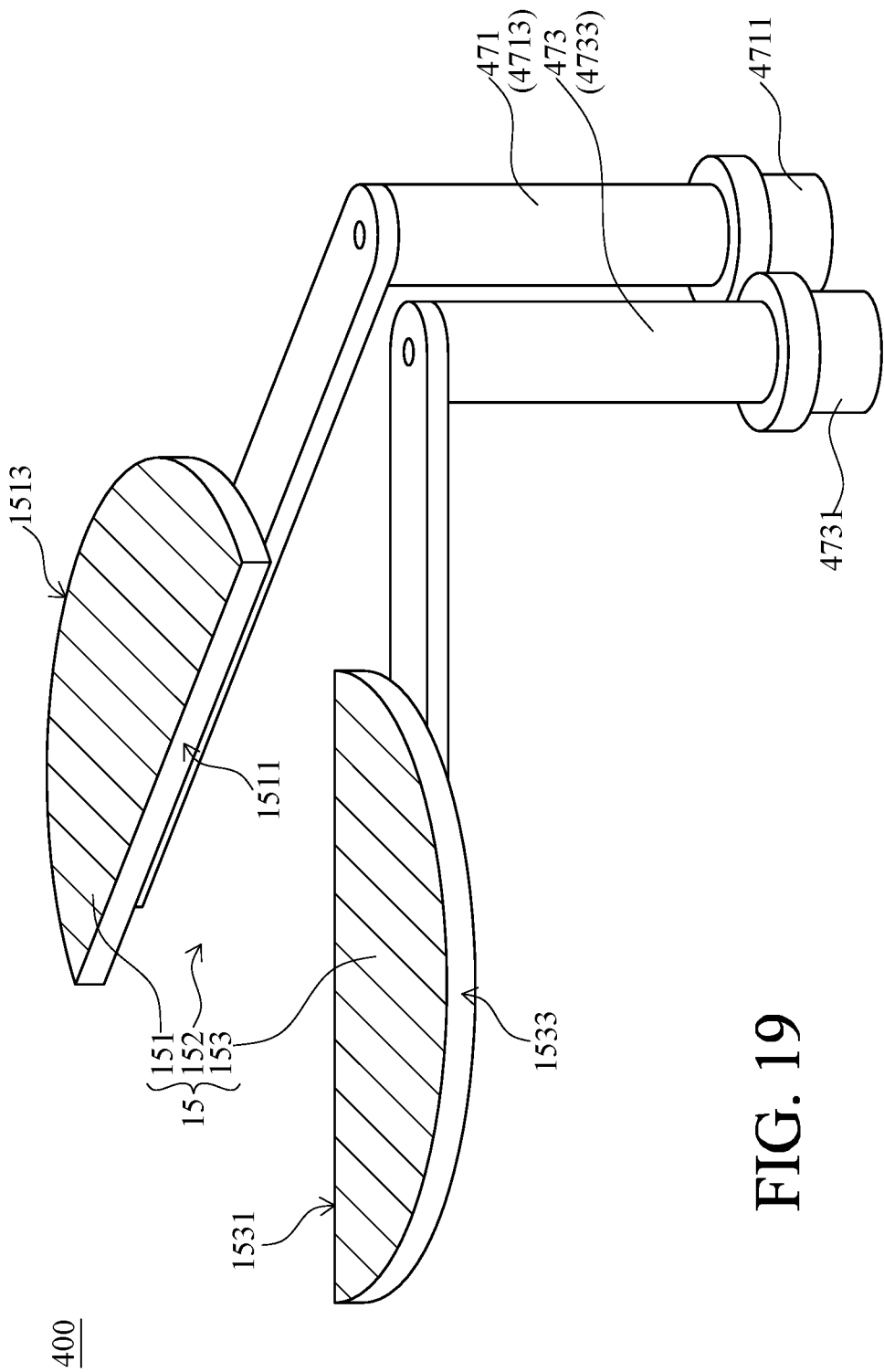
FIG. 19 is a schematic perspective view illustrating the shielding device of the thin-film-deposition equipment which is in the open state, according to one more embodiment of the present disclosure.

Referring to FIG. 19, which is a schematic perspective view illustrating the shielding device 400 of the thin-film-deposition equipment which is in the open state, according to one more embodiment of the present disclosure. In comparison with the aforementioned embodiment, the driver 47 in this embodiment is configured as a first driver 471 and a second driver 473. The first driver 471 and the second driver 473 are respectively connected power-transmittably to the first-shield member 151 and the second-shield member 153, such that to drive and swing the first-shield member 151 and the second-shield member 153 to move in the opposite directions. For example, the first-shield member 151 and the second-shield member 153 may synchronously sway in the opposite directions, respectively about an axle of the first driver 471 and an axle of the second driver 473.

To be specific, the first driver 471 and the second driver 473 can respectively drive, swing the first-shield member 151 and the second-shield member 153 to move away from each other into the open state, or to move toward each other into the shielding state.

In one embodiment of the present disclosure, the first driver 471 and the second driver 473 respectively include motors 4711, 4731 and shaft seals 4713, 4733, which are structures similar to the aforementioned motor 171 and shaft seal 173.

Also similar to the aforementioned embodiments, in practical use, the first driver 471 and the second driver 473 may be connected to the first-shield member 151 and the second-shield member 153, respectively via the first-connecting arm 141 and the second-connecting arm 143.

Surely, the first driver 471 and the second driver 473 may be configured to respectively connect to and drive the aforementioned first-shield member 251, 251a and the second-shield member 252, 252a, or even the first-shield member 351 and the second-shield member 352 with the first-guard plate 381 and the second-guard plate 383 thereon, to switch between the open state and the shielding state as well.

Moreover, in other embodiment, the two drivers 471, 473 may be disposed at or near by a corner of the containing space 12 or the reaction chamber 110, such that to allow the passage for the substrate 163 or the gas-extraction pipeline disposed at the edge side of the containing space 12 or the reaction chamber 110.

In addition, for the shielding devices 200, 300, 400 in aforementioned embodiments, the thin-film-deposition device 10 may also be further disposed with the position sensors 19, in order to detect and confirm if the shield members 251, 251a, 351, 252, 252a, 352, and/or the guard plate 381, 381a, 383, 381a are in the open state.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A thin-film-deposition equipment, comprising:
    a main body comprising:
        a reaction chamber that has a containing space; and
        two sensor areas that are connected to the reaction chamber, wherein each of the sensor areas has a sensing space fluidly connected to the containing space, and each of the sensor areas has a height shorter than the reaction chamber;
    a carrier disposed within the containing space for carrying at least one substrate; and
    a shielding device comprising:
        a first-shield member;
        a second-shield member; and
        a driver that interconnects the first-shield member and the second-shield member for driving and swinging the first-shield member and the second-shield member respectively to move in opposite directions between an open state and a shielding state, wherein in the open state, the first-shield member and the second-shield member are partially and respectively positioned within the sensing spaces of the sensor areas, and in the shielding state, the first-shield member and the second-shield member approach each other and be adjacent to each other for covering the carrier within the containing space.

2. The thin-film-deposition equipment according to claim 1, wherein the driver comprises a shaft seal and at least one motor; and the at least one motor is connected to the first-shield member and the second-shield member via the shaft seal.

3. The thin-film-deposition equipment according to claim 2, wherein the shaft seal comprises an outer tube and an inner shaft; the outer tube comprises an inner space for containing the inner shaft; the at least one motor is connected to the first-shield member via the outer tube, and is connected to the second-shield member via the inner shaft, such that to synchronously drive and swing the inner shaft and the outer tube to move in the opposite directions.

4. The thin-film-deposition equipment according to claim 1, wherein the first-shield member of the shielding device comprises a top surface, a bottom surface, and a first-inner-edge surface formed in an inclined manner relative to the top surface or the bottom surface; and wherein the second-shield member of the shielding device comprises a top surface, a bottom surface, a second-inner-edge surface relative to the top surface or the bottom surface.

5. The thin-film-deposition equipment according to claim 1, further comprising two position sensors that are respectively disposed within the sensor areas, for respectively detecting the first-shield member and the second-shield member which enter the sensing spaces.

6. The thin-film-deposition equipment according to claim 5, wherein each of the position sensors comprises an emitter and a receiver; and each of the sensor areas has two opposite surfaces respectively disposed with the emitter and the receiver.

7. The thin-film-deposition equipment according to claim 1, wherein in open state, each of the first-shield member and the second-shield member has a smaller portion within the sensing space of a corresponding one of the sensor areas, and a larger portion within the containing space.

8. The thin-film-deposition equipment according to claim 1, wherein in the shielding state, the first-shield member and the second-shield member partially overlap.

9. The thin-film-deposition equipment according to claim 1, further comprising a target material that is disposed within the containing space and that faces the carrier, wherein in the shielding state, the first-shield member and the second-shield member are positioned between the target material and the carrier.

10. The thin-film-deposition equipment according to claim 1, wherein the driver of the shielding device is disposed at a corner of the containing space of the reaction chamber.

11. The thin-film-deposition equipment according to claim 1, wherein the first-shield member of the shielding device comprises a first-inner-edge surface formed with at least one protrusion; the second-shield member of the shielding device comprises a second-inner-edge surface formed with at least one cavity; the at least one protrusion on the first-inner-edge surface corresponds to the at least one cavity on the second-inner-edge surface; and in the shielding state, the first-inner-edge surface of the first-shield member and the second-inner-edge surface of the second-shield member are adjacent to each other, the at least one protrusion on the first-inner-edge surface enters the at least one cavity on the second-inner-edge surface, the first-shield member and the second-shield member come together and cover the carrier.

12. The thin-film-deposition equipment according to claim 11, wherein when the first-shield member and the second-shield member are in the shielding state, the first-shield member and the second-shield member have a gap space therebetween.

13. The thin-film-deposition equipment according to claim 1, wherein the shielding device further comprises a first-guard plate disposed on the first-shield member; and a second-guard plate disposed on the second-shield member; and the first-guard plate and the second-guard plate respectively move along with the first-shield member and the second-shield member, for guarding the first-shield member and the second-shield member.

14. The thin-film-deposition equipment according to claim 13, wherein in the shielding state, the first-shield member and the second-shield member have a first gap space therebetween; the first-guard plate and the second-guard plate have a second gap space therebetween; and the first gap space and the second gap space do not spatially overlap.

15. The thin-film-deposition equipment according to claim 14, wherein each of the first-guard plate and the second-guard plate has an inner-edge surface; and the inner-edge surface of the first-guard plate and the inner-edge surface of the second-guard plate are formed inclined and corresponding to each other, such that in the shielding state, the inner-edge surface of the first-guard plate and the inner-edge surface of the second-guard plate face each other to form the second gap space in an inclined manner relative to the first gap space.

16. The thin-film-deposition equipment according to claim 14, wherein the shielding device has the first-guard plate formed with an area size larger than that of the second-guard plate, or has the first-shield member formed with an area size larger than that of the second-shield member.

17. The thin-film-deposition equipment according to claim 13, wherein the first-shield member of the shielding device comprises a first-inner-edge surface formed with at least one protrusion; the second-shield member of the shielding device comprises a second-inner-edge surface formed with at least one cavity; the at least one protrusion on the first-inner-edge surface corresponds to the at least one cavity on the second-inner-edge surface; and in the shielding state, the first-inner-edge surface of the first-shield member and the second-inner-edge surface of the second-shield member are adjacent to each other, the at least one protrusion on the first-inner-edge surface enters the at least one cavity on the second-inner-edge surface, the first-shield member and the second-shield member come together and cover the carrier.

18. The thin-film-deposition equipment according to claim 1, wherein there two drivers comprising a first driver connected to the first-shield member, and a second driver connected to the second-shield member.

19. The thin-film-deposition equipment according to claim 18, wherein each of the first driver and the second driver respectively comprises a shaft seal and at least one motor; and the at least one motor of the first driver is connected to the first-shield member via the shaft seal, the at least one motor of the second driver is connected to the second-shield member via the shaft seal.

20. The thin-film-deposition equipment according to claim 18, wherein the first-shield member of the shielding device comprises a first-inner-edge surface formed with at least one protrusion; the second-shield member of the shielding device comprises a second-inner-edge surface formed with at least one cavity; the at least one protrusion on the first-inner-edge surface corresponds to the at least one cavity on the second-inner-edge surface; and in the shielding state, the first-inner-edge surface of the first-shield member and the second-inner-edge surface of the second-shield member are adjacent to each other, the at least one protrusion on the first-inner-edge surface enters the at least one cavity on the second-inner-edge surface, the first-shield member and the second-shield member come together and cover the carrier.

* * * * *